(12) United States Patent
Park et al.

(10) Patent No.: US 8,303,786 B2
(45) Date of Patent: Nov. 6, 2012

(54) SPUTTERING APPARATUS

(75) Inventors: Jeong-Kweon Park, Gyeongsangbuk-do (KR); Sung-Eun Kim, Ulsan-si (KR)

(73) Assignee: LG Display Co., Ltd., Seoul (KR)

( * ) Notice: Subject to any disclaimer, the term of this patent is extended or adjusted under 35 U.S.C. 154(b) by 1042 days.

(21) Appl. No.: 11/079,288

(22) Filed: Mar. 15, 2005

(65) Prior Publication Data

US 2005/0205421 A1 Sep. 22, 2005

(30) Foreign Application Priority Data

Mar. 18, 2004 (KR) .................. 10-2004-0018492

(51) Int. Cl.
*C23C 14/34* (2006.01)

(52) U.S. Cl. ......... 204/298.25; 204/298.26; 204/298.07; 204/298.11

(58) Field of Classification Search ............. 204/298.11, 204/298.26, 298.07
See application file for complete search history.

(56) References Cited

U.S. PATENT DOCUMENTS

| | | | | |
|---|---|---|---|---|
| 3,864,239 A | * | 2/1975 | Fletcher et al. | 204/298.06 |
| 5,228,968 A | * | 7/1993 | Zejda | 204/298.07 |
| 5,441,615 A | | 8/1995 | Mukai et al. | |
| 5,487,785 A | * | 1/1996 | Horiike et al. | 118/723 E |
| 5,688,389 A | * | 11/1997 | Bjornard et al. | 204/298.25 |
| 5,885,358 A | * | 3/1999 | Maydan et al. | 118/723 R |
| 6,080,284 A | * | 6/2000 | Miyaura | 204/192.12 |
| 6,168,698 B1 | * | 1/2001 | Szczyrbowski et al. | 204/298.25 |
| 6,336,999 B1 | * | 1/2002 | Lemmer et al. | 204/192.12 |

FOREIGN PATENT DOCUMENTS

EP 1 350 864 10/2003
WO WO 01/44534 6/2001

* cited by examiner

*Primary Examiner* — Keith Hendricks
*Assistant Examiner* — Jason M Berman
(74) *Attorney, Agent, or Firm* — Morgan, Lewis & Bockius LLP

(57) ABSTRACT

A sputtering apparatus comprises a plurality of independent plasma generation regions formed in a single process chamber; a cathode disposed at an edge portion of each of the plurality of independent plasma generation regions; a gas supply line to supply a reaction gas to the plurality of independent plasma generation regions; and a shielding film disposed between the plurality of independent plasma generation regions to prevent reaction gases generated in the plurality of independent plasma generation regions from being mixed and introduced to an outside.

7 Claims, 5 Drawing Sheets

SPUTTERING APPARATUS

The present invention claims the benefit of Korean Patent Application No. 2004-018492 filed in Korea on Mar. 18, 2004, which is hereby incorporated by reference.

BACKGROUND OF THE INVENTION

1. Field of the Invention

The present invention relates to a sputtering apparatus, and more particularly, to a sputtering apparatus that effectively provides a plurality of different plasma process recipes inside a single plasma process chamber.

2. Discussion of the Prior Art

As the society has rapidly progressed into an information-oriented society, a demand for flat panel displays having excellent characteristics such as slim profile/size, light-weight, and low power consumption also has increased. Among such flat panel displays, Liquid Crystal Displays (LCDs) have been actively developed because of their superior color reproduction capability.

In general, the LCD is made by a process that includes arranging two substrates to face each other, where each substrate has an electrode formed on an inner surface, and a liquid crystal layer is filled into a gap between the two substrates. An alignment of liquid crystal molecules in the liquid crystal layer changes when a voltage is applied to the electrodes formed on the two substrates. The LCD is enabled to display an image on the screen by varying the light transmittance in accordance with the change in the alignment of the liquid crystal molecules.

The LCD generally has a lower substrate and an upper substrate. The lower substrate is a TFT substrate, which includes a plurality of thin film transistors (TFTs) for applying a signal to a pixel electrode. The TFT is formed by repeating the step of forming and etching metal and insulating layers. The upper substrate is a color filter substrate, which includes a color filter layer having red (R), green (G) and blue (B) color filters arranged in sequential order.

A black matrix layer, which is used for the color filter substrate or an electrode for the TFT substrate, is generally formed by depositing chromium (Cr) by a sputtering apparatus. To form a thin film using sputtering, a target material (a raw material) of the thin film is loaded in a vacuum chamber. A substrate is also disposed at a position corresponding to the target material inside the vacuum chamber. Argon (Ar) ions are supplied into the vacuum chamber to generate plasma. The Ar ions, generated during the formation of the plasma, collide with a surface of the target material, which is negatively charged. Accordingly, target particles emitted from the target material are deposited on the substrate.

A diode sputtering method, a bias sputtering method, an RF sputtering method, a triode sputtering method, a magnetron sputtering method and other suitable sputtering methods are used to form thin films. The magnetron sputtering method, which is widely used, has an advantage of enhancing the thin film deposition rate. The enhancement is achieved by forming the higher density plasma around the target material. Since there is a magnet mounted on a back surface of the target material, more target particles can be emitted.

The sputtering apparatus used in the above described magnetron sputtering methods can be generally classified into an in-line type sputtering apparatus and a cluster type sputtering apparatus.

Compared with the cluster type sputtering apparatus, the in-line type sputtering apparatus enables consecutive sputtering in a local region because a gas is controlled to flow toward a center from a side. Thus, a flow of gas in the in-line type sputtering apparatus shifts in a direction of the substrate transfer. Accordingly, the in-line type sputtering apparatus has a disadvantage in that it is difficult to control the particles and to process in an open process section.

Unlike the in-line type sputtering apparatus, the cluster type sputtering apparatus controls the gas flow from a lower portion toward an upper portion. In the cluster type sputtering apparatus, the target material has an area corresponding to a size of the substrate during the formation of plasma. In addition, plasma is generated gradually depending on the rate of substrate transfer. Thus, the cluster type sputtering apparatus has some advantages, such as easy control of gas flow and small generation of particle source, and has a disadvantage that a plurality of layers cannot be deposited inside a narrow space.

Accordingly, a sputtering apparatus that can deposit a plurality of layers inside a narrow space has been developed that can effectively use a sputtering space by removing a buffer space.

SUMMARY OF THE INVENTION

Accordingly, the present invention is directed to a sputtering apparatus that substantially obviates one or more of the problems due to limitations and disadvantages of the related art.

An object of the present invention is to provide a sputtering apparatus that can effectively provide a plurality of different plasma recipes in a single plasma process chamber.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described, a sputtering apparatus includes a plurality of independent plasma generation regions formed in a single process chamber; a cathode disposed at an edge portion of each of the plurality of independent plasma generation regions; a gas supply line to supply a reaction gas to the plurality of independent plasma generation regions; and a shielding film disposed between the plurality of independent plasma generation regions to prevent reaction gases generated in the plurality of independent plasma generation regions from being mixed and introduced to an outside.

In another aspect, A sputtering apparatus for depositing a thin film on an article includes a cathode disposed at an edge portion of each of a plurality of independent plasma generation regions such that the plurality of independent plasma generation regions are formed inside a single process chamber; a gas supply unit provided at positions corresponding to the cathode; and a shielding film disposed between the plurality of independent plasma generation regions to restrict a gas flow; and a mask disposed in the plurality of independent plasma generation regions to enhance the thin film deposition efficiency on the article by limiting a passage of gas flow toward the article while the thin film is being deposited.

In another aspect, the sputtering apparatus includes a cathode disposed at an edge portion of each of a plurality of independent plasma generation regions such that the plurality of independent plasma generation regions are formed inside a single process chamber; a gas supply unit provided at positions corresponding to the cathode; a shielding film disposed between the plurality of independent plasma generation regions to restrict a gas flow; and a gas suction unit disposed around the shielding film to remove by suction, a gas flowing from each of the plurality of independent plasma generation regions to an outside, wherein the plurality of independent plasma generation regions each have different reaction gases therein.

In another aspect, the sputtering apparatus for depositing a thin film on an article includes a cathode disposed at an edge portion of each of a plurality of independent plasma generation; a gas supply unit provided at positions corresponding to the cathode, and selectively changes a size of a gas injection nozzle when supplying a gas; and a mask disposed in the plurality of independent plasma generation regions to enhance a thin film deposition efficiency on the article by limiting a passage of gas flow toward the article while the thin film is being deposited.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
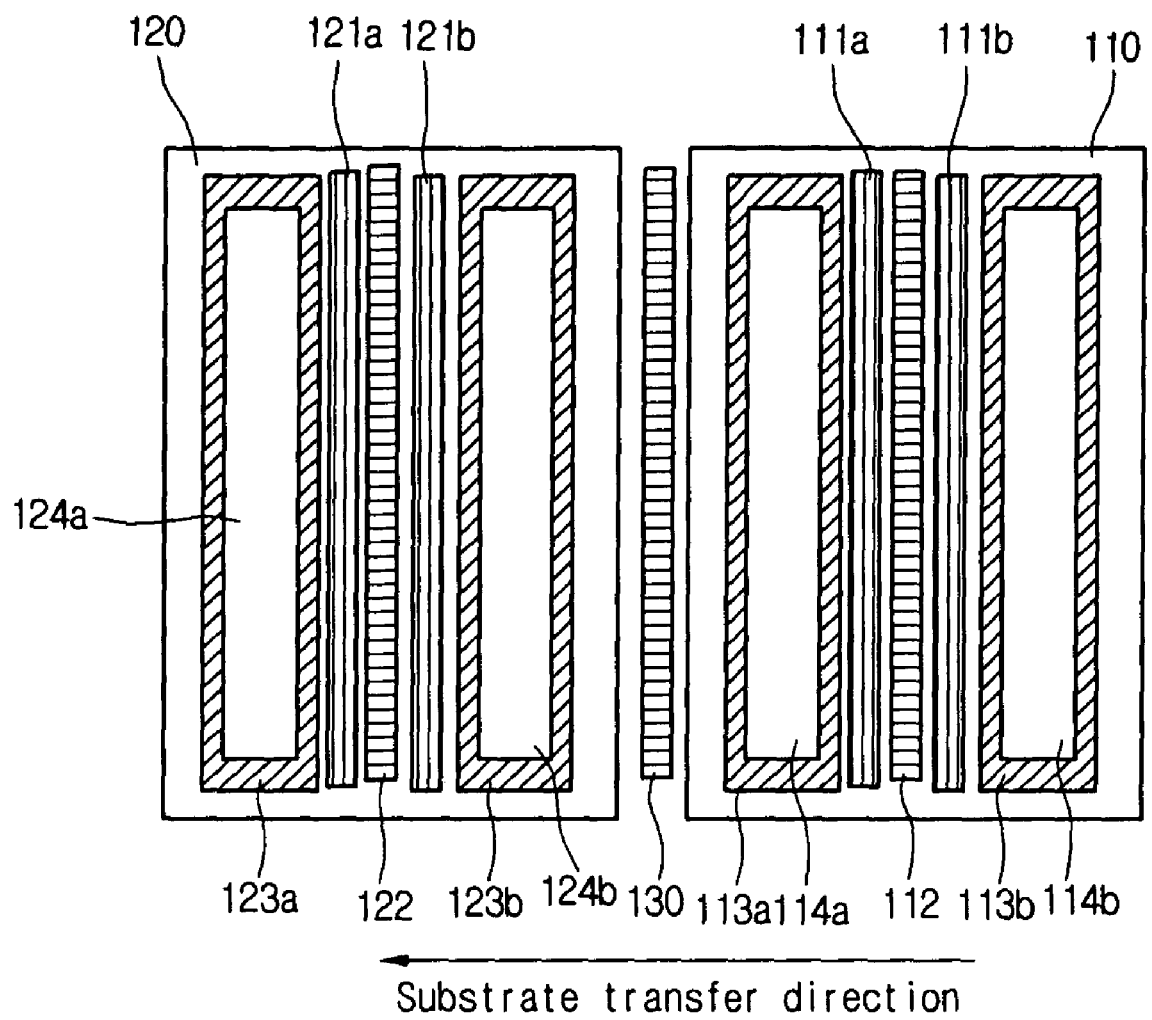
FIG. 1 is a schematic view of a sputtering apparatus according to an embodiment of the present invention.

FIG. 1 is a front view of a sputtering apparatus according to an embodiment of the present invention. Referring to FIG. 1, the sputtering apparatus includes a plurality of process chambers, for example, a first chamber 110 and a second chamber 120 to attain independent injections. The first chamber 110 and the second chamber 120 provide independent plasma generation regions 114a, 114b, 124a and 124b, and enable a plurality of layers to be deposited in a narrow space.

Accordingly, the sputtering apparatus is characterized by having the independent plasma generation regions 114a, 114b, 124a and 124b to effectively provide different plasma recipes in the respective process chambers 110 and 120. To accomplish this purpose, cathodes 113a, 113b, 123a and 123b and shielding films 111a, 111b, 121a and 121b are disposed in vertical type plasma generation regions to form each layer.

In addition, the sputtering apparatus is enabled to perform a substrate transfer and a plasma generation simultaneously. The sputtering apparatus is characterized in that a process reaction gas is sucked or exhausted by gas suction units 112, 122 and 130 such that the reaction gas is prevented from flowing into an unwanted process chamber having a different recipe. Thus, the sputtering apparatus enables an independent deposition process by controlling a gas flow in a narrow space.

In depositing a layer using the sputtering apparatus of the present invention under the same recipe, the gas suction units 112, 122 and 130 do not require a separate system for preventing gases from being mixed. Furthermore, the sputtering apparatus used in the above-described condition enables the process chamber to have various constructions.

Figure 2:
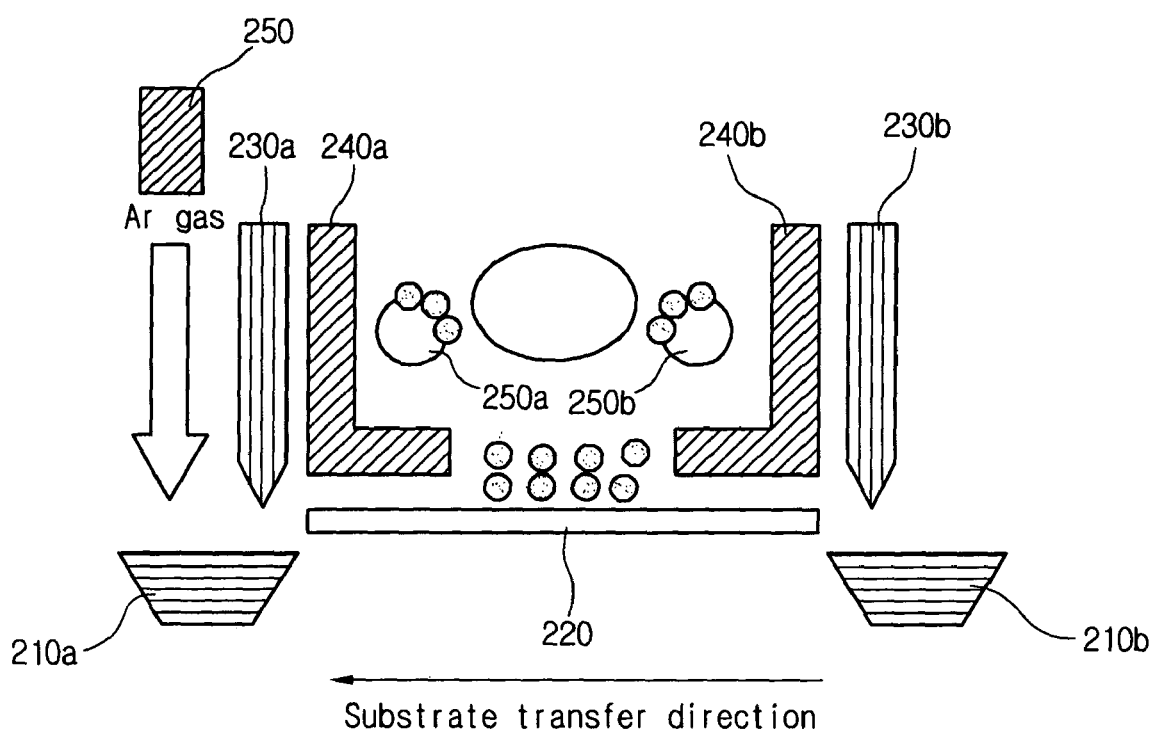
FIG. 2 illustrates a system for preventing gases from being mixed and supplied in a sputtering apparatus according to an embodiment of the present invention.

Moreover, when argon (Ar) gas is blown between the first process chamber 110 and the second process chamber 120, the respective process chambers 110 and 120 are adapted to operate independently. Accordingly, the process chamber is not influenced by an adjacent chamber and is operable under the same condition. With reference to FIG. 2, the system for preventing gases from being mixed and supplied in the sputtering apparatus of the present invention will be described.

FIG. 2 is a sectional view of a selected plasma generation region provided in each process chamber, which illustrates a system for preventing gases from being mixed and supplied in a sputtering apparatus according to an embodiment of the present invention.

Referring to FIG. 2, shielding films 230a and 230b are disposed inside each process chamber. Gas suction unit 210a and 210b are disposed below the shielding films 230a and 230b. Masks 240a and 240b are disposed in each of the plurality of independent plasma generation regions. Injection nozzles 250a and 250b are disposed inside each of the plurality of independent plasma generation regions.

The shielding films 230a and 230b prevent gases from getting mixed at a portion between the plurality of plasma generation regions provided in each process chamber. Ar gas blows in a vertical direction along side portions of the shielding films 230a and 230b. Accordingly, restricting the flow of gas within the plurality of independent plasma generation regions is achieved by using the shielding films 230a and 230b and the method implemented to blow the Ar gas. The blowing of the Ar gas is performed by a gas injection unit (250).

In addition, gas suction units 210a and 210b disposed below the shielding films 230a and 230b direct a reaction gas into each of the plurality of plasma generation regions by suction, which enables the prevention of the reaction gas from flowing to an outside of the plurality of independent plasma generation regions. The flow of the reaction gas is restricted by the shielding films 230a and 230b and the method implemented to blow the Ar gas.

For example, when an independent reaction gas introduced into each of the plurality of independent plasma generation regions flows over the shielding films 230a and 230b, the reaction gas is prevented from flowing to the outside by the Ar gas injection unit (250) blowing the Ar gas. The reaction gas is exhausted by the gas suction units 210a and 210b, and the Ar gas is exhausted by the Ar gas injection unit (250). At this time, the gas suction units 210a and 210b perform a function to maintain a vacuum level as well as the function to exhaust the reaction gas.

Furthermore, masks 240a and 240b restrict plasma flow in each of the plurality of independent plasma generation regions. The masks 240a and 240b are designed to maintain an open area which is half an area that of an overall area for a single independent plasma generation region. Accordingly, a passage of gas flow is made narrow and deposition efficiency in a selected region on a substrate (220) is enhanced.

Injection nozzles 250a and 250b inject the reaction gas, and they are arranged to orient toward a center of each of the plurality of independent plasma generation regions. Each of the injection nozzles 250a and 250b has a plurality of nozzle holes having different sizes such that an amount of gas injection is controlled depending on locations of the nozzles holes. Herein, the Ar gas is continuously blown by the Ar gas injection unit (250), in which the reaction gases introduced from the respective plasma generation regions are prevented from getting mixed.

Next, with reference to FIGS. 3 through 5, formation of independent gas regions in the respective independent plasma generation regions of the sputtering apparatus will be described.

Figure 3:
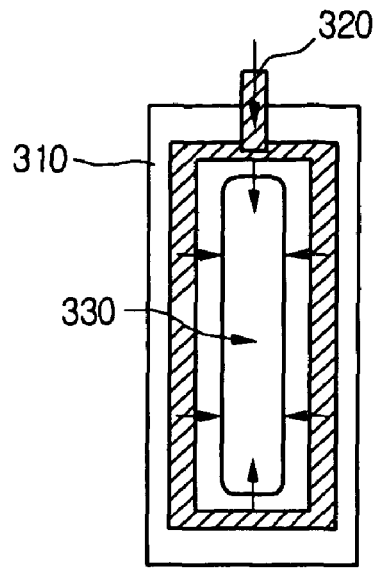
FIG. 3 is a schematic view illustrating a selected plasma generation region provided in a sputtering chamber according to an embodiment of the present invention.

FIG. 3 is a schematic view of a selected plasma generation region provided in the process chamber of FIG. 2 and illustrates that a mixed gas is supplied to the selected plasma generation region. FIGS. 4 and 5 are views illustrating that independent gas regions are formed at respective plasma generation regions provided in a process chamber of the present invention.

Referring to FIG. 3, an independent plasma generation region 330 has a separate gas supply line 320 for supplying a reaction gas thereinto. The gas supply line 320 is disposed at a portion corresponding to a cathode 310. Since the cathode 310 and the gas supply line 320 are disposed in each of the plurality of independent plasma generation regions 330, each of the plurality of independent plasma generation regions 330 can generate independent plasma.

Figure 4:
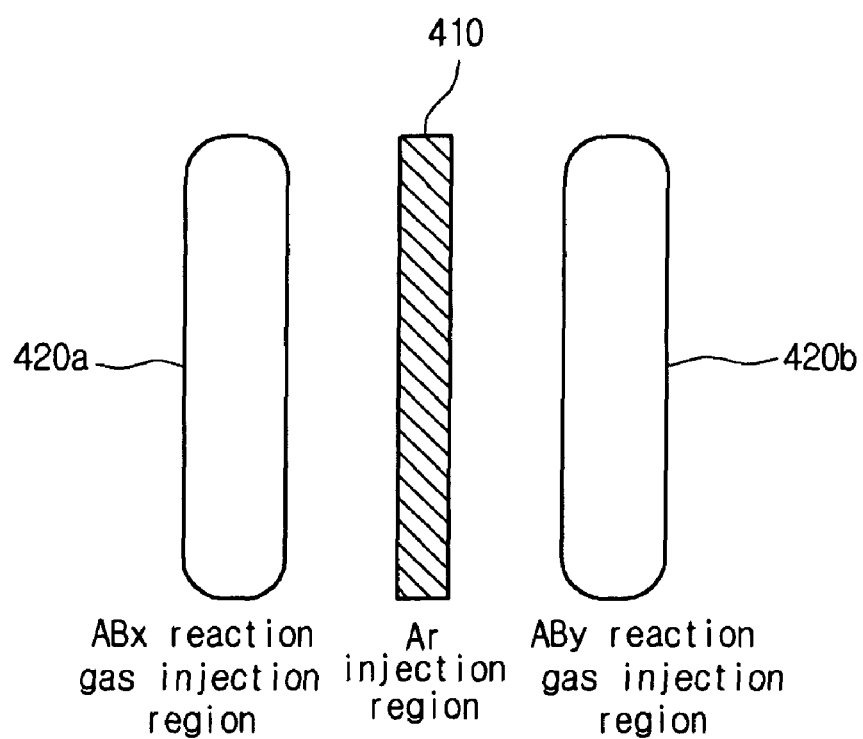
FIGS. 4 and 5 are views illustrating independent gas regions formed in each of a plurality of plasma generation regions provided in a process chamber of a sputtering apparatus according to an embodiment of the present invention.
Figure 5:
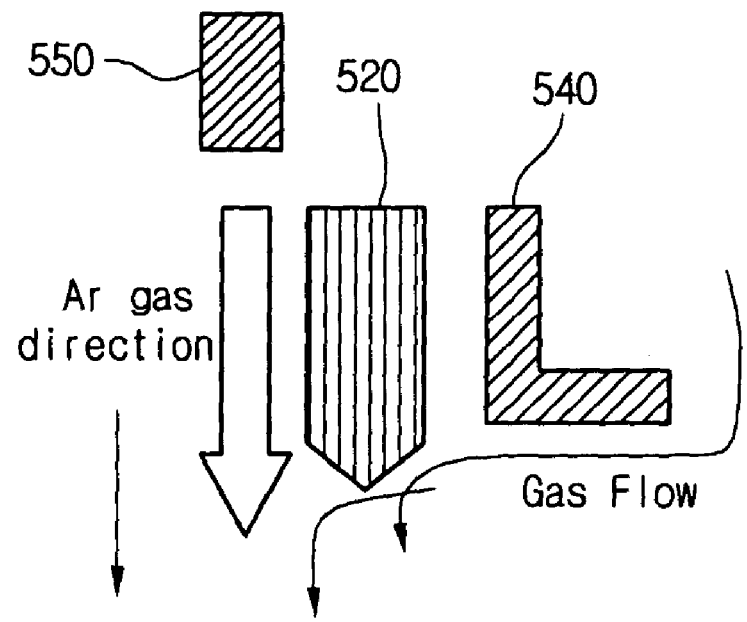

Referring to FIGS. 4 and 5, the generated plasma can prevent the reaction gas introduced into the each of the plurality of independent plasma generation regions 330 from flowing to an outside by a shielding film 520 (FIG. 5) and the method implemented to blow Ar gas in the present invention. In addition, the reaction gas, which leaked from each of the plasma generation regions flowing down along a mask 540 and the shielding film 520, is again introduced into a gas suction unit (550). The Ar gas injection unit (550) blowing the Ar gas vertically also contributes to directing the reaction gas to the suction unit (550).

As shown in FIG. 4, one of the plurality of plasma generation regions becomes an ABx reaction gas injection region 420a and adjacent region becomes an ABy reaction gas injection region 420b. Accordingly, the sputtering apparatus of the present invention can perform plural processes in the opened single process chamber.

Figure 6:
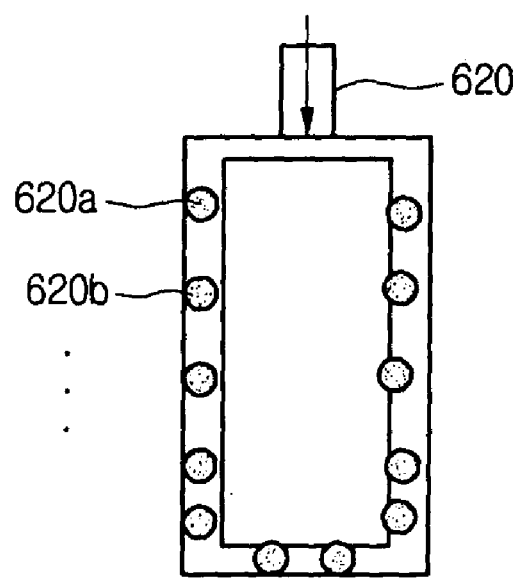
FIGS. 6 and 7 are views illustrating the position and shape of gas injection nozzles for supplying reaction gas to a selected plasma generation region provided in a process chamber of a sputtering apparatus according to an embodiment of the present invention.
Figure 7:
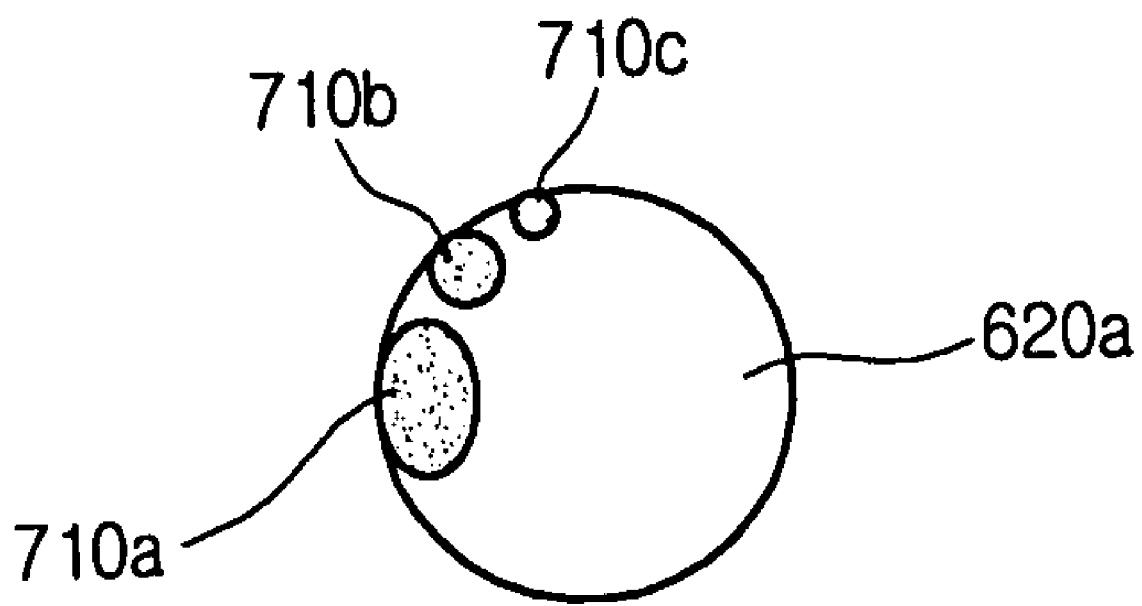

FIGS. 6 and 7 are views illustrating position and shape of a gas injection nozzle for supplying reaction gas to a selected plasma generation region according to an embodiment of the present invention. Referring to FIGS. 6 and 7, a plurality of injection nozzles 620a, 620b, . . . are disposed along a periphery of a gas supply line 620. The gas supply line 620 is shaped in a rectangular ring inside a selected plasma generation region of a process chamber in the sputtering apparatus according to the present invention.

Reaction gas introduced through the gas supply line 620 are injected into each of the plurality of plasma generation regions through the respective injection nozzles 620a, 620b, . . . , thereby forming uniform plasma in each of the plurality of plasma generation regions.

Each of the plurality of injection nozzles 620a, 620b, . . . is designed to have nozzle holes 710a, 710b and 710c having different sizes. While FIG. 7 exemplarily shows three nozzle holes 710a, 710b and 710c, the number of the nozzles holes may be modified.

Accordingly, the nozzle holes 710a, 710b and 710c having different sizes inject the reaction gas, thereby generating uniform plasma in a core region and enhancing the plasma efficiency. In addition, reduction of an installation space for the sputtering apparatus can be achieved by enabling the plural processes in a narrow space. Furthermore, a plurality of plasma generation regions can be obtained by controlling gas flow.

Moreover, enhancement of plasma efficiency, uniformity, and efficiency in target usage are achieved by forming the plurality of plasma generation regions in a row in a vertical direction and using a magnet. Accordingly, as described above, the sputtering apparatus of the present invention has an advantage that can effectively provide a plurality of different plasma recipes in a single plasma process chamber.

It will be apparent to those skilled in the art that various modifications and variations can be made in the sputtering apparatus of the present invention without departing from the spirit or scope of the invention. Thus, it is intended that the present invention covers the modifications and variations of this invention provided they come within the scope of the appended claims and their equivalents.

What is claimed is:

1. A sputtering apparatus, comprising:
a plurality of process chambers;
a plurality of independent plasma generation regions formed in each process chamber;
each plasma generation region including:
   a cathode;
   first and second masks disposed on both sides of the cathode; and
   a gas supply line disposed along an edge portion of the cathode within the first and second masks to supply reactive gases to the plasma generation region,
first and second shielding films disposed between the first mask of a first plasma generation region and the second mask of a second plasma generation region adjacent to the first plasma generation region to prevent reaction gases generated in the plurality of independent plasma generation regions from being flown to an outside by Ar gas flowing between the first and second shielding films;
a gas injection unit disposed over the first and second shielding films between the plasma generation regions to allow the Ar gas to be flown in a vertical direction between the first and second shielding films; and
a gas suction unit disposed between the plasma generation regions to remove by suction and to exhaust reaction gases generated in the plurality of independent plasma generation regions.

2. The sputtering apparatus according to claim 1, further comprising:
a plurality of injection nozzles disposed along the gas supply line.

3. The sputtering apparatus according to claim 2, wherein each injection nozzle has a plurality of holes with different sizes.

4. The sputtering apparatus according to claim 1, wherein each plasma generation region has an open area which is half by the first and second masks.

5. The sputtering apparatus according to claim 1, wherein each mask has a side portion and a bottom portion.

6. The sputtering apparatus according to claim 1, further comprising:
   another gas suction unit and another injection unit facing with each other and disposed between the process chambers.

7. The sputtering apparatus according to claim 1, wherein the gas suction unit is disposed betweens the process chambers.

* * * * *